US006643185B1

(12) United States Patent
Wang et al.

(10) Patent No.: US 6,643,185 B1
(45) Date of Patent: Nov. 4, 2003

(54) METHOD FOR REPAIRING OVER-ERASURE OF FAST BITS ON FLOATING GATE MEMORY DEVICES

(75) Inventors: Zhigang Wang, Santa Clara, CA (US); Nian Yang, San Jose, CA (US); Jiang Li, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/215,140

(22) Filed: Aug. 7, 2002

(51) Int. Cl.[7] .............................................. G11C 16/04
(52) U.S. Cl. ................................ 365/185.3; 365/185.27
(58) Field of Search ........................ 365/185.3, 185.24, 365/185.27, 185.14, 218, 185.26

(56) References Cited

U.S. PATENT DOCUMENTS 5,526,315 A * 6/1996 Kaya et al. ............. 365/185.18
6,249,459 B1 * 6/2001 Chen et al. ............. 365/185.26
6,483,751 B2 * 11/2002 Chen et al. ............. 365/185.26

* cited by examiner

*Primary Examiner*—Thong Le
(74) *Attorney, Agent, or Firm*—Wagner, Murabito & Hao LLP

(57) ABSTRACT

A method for repairing over-erasure of floating gate memory devices. Specifically, one embodiment of the present invention discloses a method for performing a program disturb operation on an array of memory cells for repairing over-erasure of fast bits. The program disturb operation is applied simultaneously to the entire array making it compatible with channel erase schemes. The fast bits are programmed back to a normal state above 0 Volts by applying a substrate voltage to a substrate common to the array of memory cells. A gate voltage is applied to a plurality of word lines coupled to control gates of said array of memory cells. A program pulse time for applying voltages ranges from approximately 10 microseconds to 1 second. A voltage differential between a control gate and the substrate in a memory cell is in the range of approximately 9 Volts to about 20 Volts.

20 Claims, 5 Drawing Sheets

METHOD FOR REPAIRING OVER-ERASURE OF FAST BITS ON FLOATING GATE MEMORY DEVICES

TECHNICAL FIELD

The present invention relates to the field of microelectronic integrated circuits. Specifically, the present invention relates to a memory device including a homogeneous oxynitride tunneling dielectric layer.

BACKGROUND ART

A flash or block erase memory (flash memory), such as, Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

A memory of this type includes individual Metal-Oxide Semiconductor (MOS) memory cells that are field effect transistors (FETs). Each FET, or flash, memory cell includes a source, drain, floating gate and control gate to which various voltages are applied to program the cell with a binary 1 or 0, or erase all of the cells as a block. The flash memory cell provides for nonvolatile data storage.

A typical configuration of a flash memory cell 100 consists of a thin, high-quality tunnel oxide layer 140 sandwiched between a conducting polysilicon floating gate and a crystalline silicon semiconductor substrate. The tunnel oxide layer is typically composed of silicon oxide ($Si_xO_y$). The substrate includes a source region and a drain region that can be separated by an underlying channel region. A control gate is provided adjacent to the floating gate, and is separated by an interpoly dielectric. Typically, the interpoly dielectric can be composed of an oxide-nitride-oxide (ONO) structure.

The flash memory cell stores data by holding charge within the floating gate. In a write operation, charge can be placed on the floating gate through hot electron injection, or Fowler-Nordheim (F-N) tunneling. In addition, F-N tunneling can be typically used for erasing the flash memory cell through the removal of charge on the floating gate.

A common failure in flash memory is a programming failure due to an over-erased cell. During an erase process, not all bits in an array erase in the same way. FIG. 1 is a chart 100 illustrating a Gaussian distribution (illustrated by curve 140) of threshold voltages for an array of flash memories that have been erased. Line 110 represents the reference voltage, and its corresponding current, from which it is determined whether a memory cell has been erased. Threshold voltages of memory cells below the reference voltage indicate that those memory cells are erased.

When a column of flash memory cells, in an array of flash memory cells, is erased in parallel, some memory cells are erased very quickly (fast bits) while other memory cells are harder to erase (slow bits). A small percentage of over-erased bits having threshold voltages below 0 volts is shown in tail region 120 of FIG. 1.

In addition, the fast bits create a non-Gaussian distribution of threshold voltages as indicated by dotted line 130, which leads to a wider distribution of threshold voltages. This can be problematic especially when implementing multi-level voltage devices, where voltage tolerances are reduced.

Unfortunately, having an over-erased cell on the same column line with a programmed bit can cause a failure when the programmed bit is read. The over-erased cell produces a leakage current and causes the entire column to malfunction. In particular, the current that is read from the column should be below the reference current ($I_{Ref}$) that corresponds to the threshold voltage illustrated by line 110, when reading a programmed cell having a higher threshold voltage. $I_{Ref}$ is the erased cell reference current used for comparison.

However, if an over-erased cell is in the same column as that of the programmed cell, the over-erased cell has a threshold voltage that is less than 0 producing a leakage current ($I_{Leak}$). As such, the total current read from the column will include the current from the programmed memory cell ($I_{Program}$) and the leakage current. If the sum of $I_{Program} + I_{Leakage} > I_{Ref}$, then the total current being read from the column is greater than the reference current, and the programmed cell appears to be erased.

One prior art solution is to slightly program the over-erased cells from the drain side to bring the threshold voltages of the over-erased cells in tail region 120 back above 0 volts. The prior art process is named Automatic Program Disturb after Erase (APDE). The APDE process includes applying approximately 5 Volts to the drain region of a memory cell, and grounding the control gate and source regions. The respective voltages are applied for approximately 100 ms in order to weakly reprogram the over-erased cell to approximately 0 volts.

Unfortunately, the APDE process is a column by column fix, which can become an inefficient and lengthy process, especially as memory arrays become larger. For example, the APDE process is applied to memory cells in an entire column in parallel. Only the bits that are over-erased will program. The memory cells that are not over-erased will not program.

Additionally, the APDE process will not correct memory cells that have larger negative threshold voltages. In other words, the APDE process can only correct threshold voltages up to a limit. Line 160 illustrates the negative threshold voltage beyond which the APDE process is unable to reprogram threshold voltages back to approximately 0 Volts. As such, the APDE process cannot correct memory cells within tail region 120 with highly negative threshold voltages that extend the distribution 100 well into the negative region.

DISCLOSURE OF THE INVENTION

The present invention provides a method for repairing over-erasure of floating gate memory devices that is applied on an array-wide basis for better efficiency. Embodiments of the present invention also provide for a method for compacting the distribution of threshold voltages for memory cells in an array of memory cells Specifically, one embodiment of the present invention discloses a method for performing a program disturb operation for repairing over-erasure of non-volatile memory. The non-volatile memory comprises at least one array of memory cells arranged in a plurality of rows and a plurality of columns, a plurality of word lines coupled to said plurality of rows, a plurality of bit lines coupled to said plurality of columns. Each of the memory cells comprise a source, a control gate coupled to a respective word line, and a drain coupled to a respective bit line, and is capable of storing a respective bit.

The method for correcting over-erasure of the array of memory cells comprises the step of performing an array wide program disturb operation for repairing over-erasure of fast bits. The program disturb operation is applied simultaneously to the entire array making it compatible with channel erase schemes. The fast bits are programmed back to a normal state to approximately 0 Volts by applying a substrate voltage to a substrate common to the array of memory cells. A gate voltage is applied to a plurality of word lines coupled to control gates of the array of memory cells. A program pulse time for applying voltages ranges from approximately 10 microseconds to 1 second. A voltage differential between a control gate and the substrate in a memory cell of the array is in the range of approximately 9 Volts to about 20 Volts.

In another embodiment, the method described above for performing an array wide program disturb operation compacts the distribution of voltage thresholds for memory cells in the array of non-volatile memory cells. The distribution of voltage thresholds is tighter than a Gaussian distribution of voltage thresholds for memory cells after an erase operation.

BRIEF DESCRIPTION OF THE DRAWINGS

PRIOR ART

BEST MODES FOR CARRYING OUT THE INVENTION

Reference will now be made in detail to the preferred embodiments of the present invention, a method for performing a program disturb operation for repairing over-erasure of non-volatile memory. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a method for repairing over-erasure of floating gate memory devices that is applied on an array-wide basis for better efficiency. Also, embodiments of the present invention also provide for a method for compacting the distribution of threshold voltages for memory cells in an array of memory cells.

Figure 2:
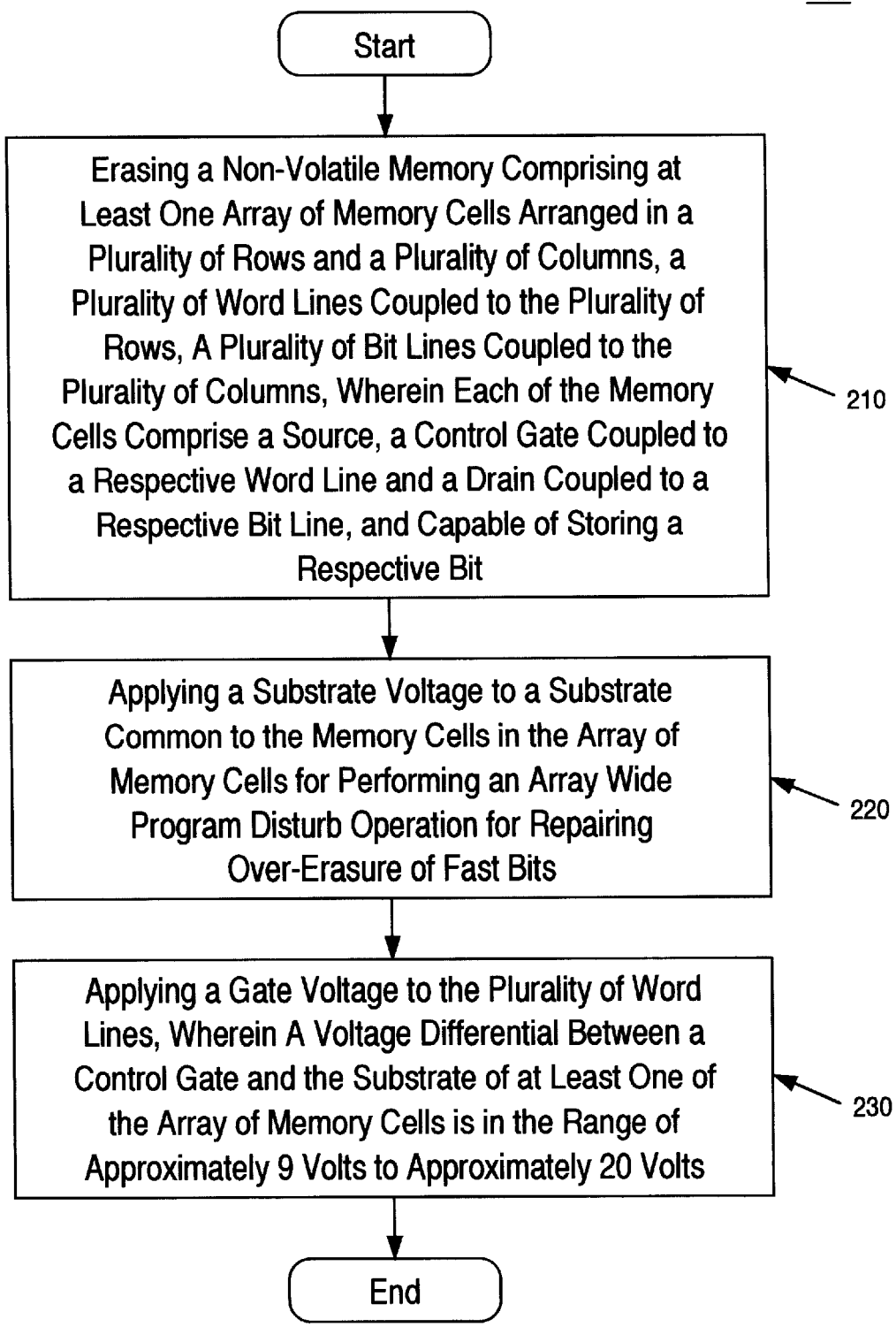
FIG. 2 is a flow chart illustrating steps in a method for performing a program disturb operation for repairing over-erasure of non-volatile memory, in accordance with one embodiment of the present invention.

FIG. 2 is flow chart 200 illustrating steps in a computer implemented method for repairing over-erasure of floating gate memory devices, in accordance with one embodiment of the present invention. The present embodiment begins with a non-volatile memory device that comprises at least one array of memory cells. The memory cells in the array are arranged in a plurality of rows and a plurality of columns. A plurality of word lines are coupled to the plurality of rows. A plurality of bit lines are coupled to the plurality of columns. In one embodiment, the array of memory cells can be arranged in a NOR type non-volatile memory.

Figure 3:
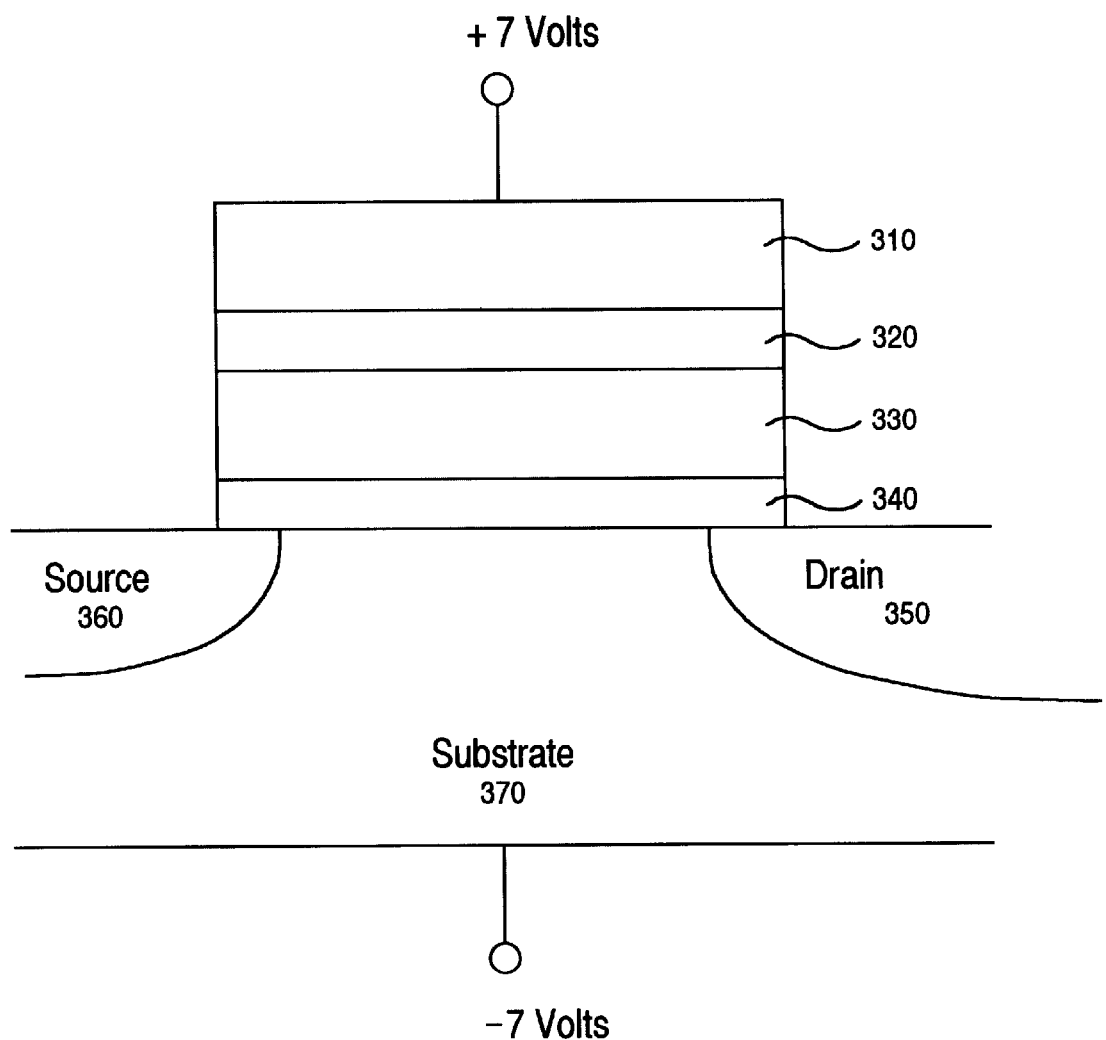
FIG. 3 is a cross-sectional view of a semiconductor flash memory cell illustrating the voltages applied during a program disturb operation for repairing over-erasure of non-volatile memory, in accordance with one embodiment of the present invention.

A typical configuration of a memory cell 300, that is a flash memory cell, for implementation within the array of memory cells is shown in FIG. 3, in accordance with one embodiment of the present invention. The memory cell 300 consists of a thin, high-quality tunnel oxide layer 340 sandwiched between a conducting polysilicon floating gate 320 and a crystalline silicon semiconductor substrate 370. The tunnel oxide layer 340 is typically composed of silicon oxide ($Si_xO_y$). The substrate 370 includes a source region 360 and a drain region 350 that can be separated by an underlying channel region. A control gate 310 is provided adjacent to the floating gate 330, and is separated by an interpoly dielectric 320. Typically, the interpoly dielectric 320 can be composed of an oxide-nitride-oxide (ONO) structure.

While embodiments of the present invention are discussed within the context of the memory cell as described in FIG. 3, other embodiments of the present invention are well suited to arrays of memory cells suitable for and supporting a wide range of flash memories.

In step 210 of flow chart 200, the non-volatile memory including the array of memory cells is erased. In one embodiment, the highly scaled NOR type array of flash memory can be erased through a negative gate erase scheme through the channel for core cell erasure. The negative gate erase method takes advantage of the Fowler-Nordheim tunneling of electrons. To erase the cell, a high negative potential (approximately –10 Volts) is applied to the control gate 310 and approximately 5 Volts is applied to the source region 360. Flash memories are typically erased on a sector wide basis. A sector can contain one or more arrays of memory cells.

During the negative gate erase scheme, a large voltage potential between the floating gate 330 and the source region 360 is created in the source overlap region where the floating gate 330 overlaps the source region 360. Electrons tunnel off the floating gate 330 to the source region 360. As electrons leave, the voltage level of the floating gate 330 increases and the voltage level of the floating gate 330 becomes more positive.

During the high voltage gate erase on high density memory arrays, over-erase on some memory cells can take place, leading to the so-called fast bits, as previously discussed. In order to achieve an efficient fast bit repair for NOR type memory arrays, an efficient program disturb repair method is based on the channel programming for repairing over-erasure of fast bits, in accordance with one embodiment.

In step 220, a substrate voltage is applied to the substrate 370 that is common to the memory cells in the array of memory cells. In one embodiment, the substrate voltage is between negative zero to ten volts (–0 to –10 volts).

In step 230, a gate voltage is applied to the plurality of word lines in the array of memory cells. The plurality of word lines are coupled to the control gates of the individual memory cells in the array of memory cells. In one embodiment the gate voltage is between positive zero to ten volts (+0 to +10 volts).

A voltage differential between the control gate and the substrate of at least one of the array of memory cells is in the range of approximately 0 volts to approximately 20 volts. The appropriate voltage differential programs the fast bits that have been over-erased back to a normal voltage threshold Gaussian distribution.

The method as disclosed in flow chart 200 is applicable to a wide range of flash memories, and is very efficient since an entire wordline in the array of memory cells is repaired at each time. In one embodiment the method as disclosed in flow chart 200 is applicable on an array and/or sector wide basis (up to several kilobytes with the whole sector of the memory array, instead of several hundreds of bits on one bitline in Automatic Disturb Program after Erase (ADPE) processes). In this way the method as disclosed in flow chart 200 is in-line with the channel erase scheme where the whole sector is erased each time.

FIG. 3 is a diagram of a flash memory cell with appropriate voltages applied for repairing over-erasure of floating gate memory devices, in accordance with one embodiment of the present invention. A voltage differential of 14 volts is applied between the control gate 310 and the substrate 370. Approximately, a positive seven (+7.0) volts is applied to the control gate 310. Also, approximately, a negative seven (−7.0) volts is applied to the substrate 370.

The program pulse for repairing over-erasure of the fast bits is short in time period, and is thus self-limited. The self-limit is achieved because the normal bit (voltage threshold above 0 volts) is programmed much slower than the fast bit memory cells within the program time interval due to the low program field on the normal bits having normal threshold voltages. In one embodiment, the time period for the program pulse ranges between approximately 0 to 1 second. For example, in FIG. 3, the +7.0 volts applied to the control gate 310 and the −7.0 volts applied to the substrate can be applied for approximately 10 ms to 1 second, depending on the device type and operation.

Figure 1:
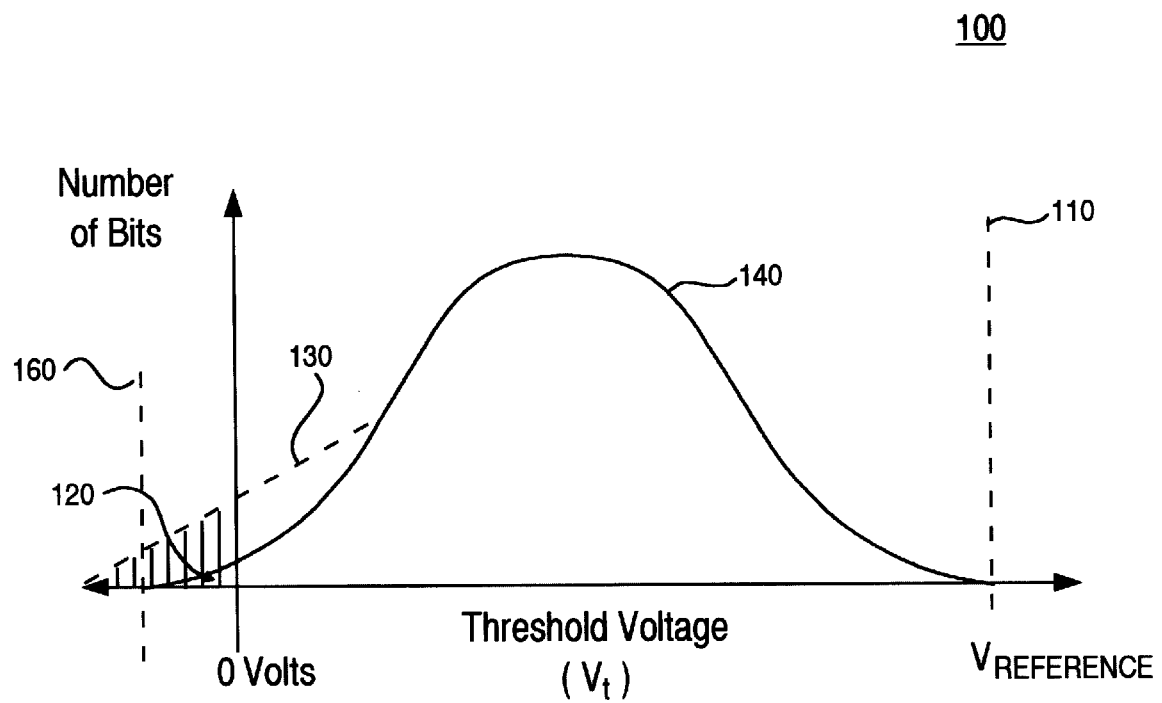
FIG. 1 is a chart illustrating the distribution of threshold voltages in an array of memory cells with memory cells that are over-erased (fast bits).
Figure 4:
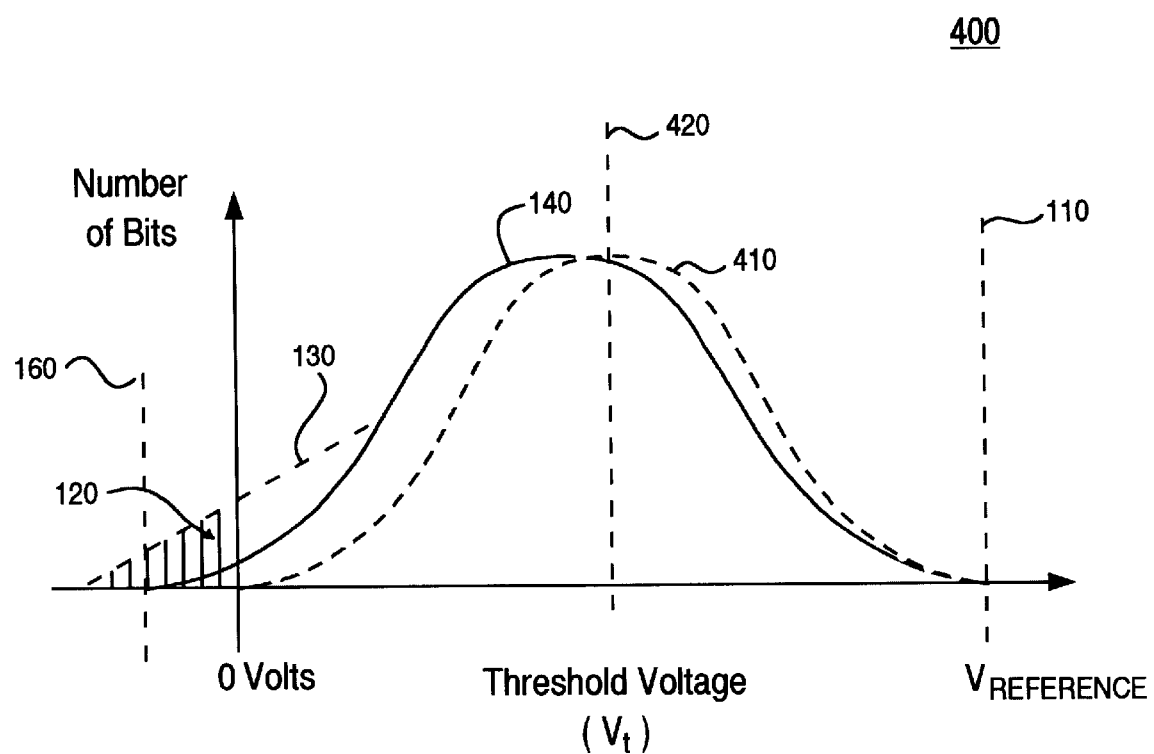
FIG. 4 is a chart illustrating the distribution of threshold voltages in an array of memory cells that have corrected for over-erasure of fast bit memory cells, in accordance with one embodiment of the present invention.

FIG. 4 is a chart 400 illustrating the distribution of voltage thresholds on an array of memory cells that has been corrected for over-erasure of fast bits, in accordance with one embodiment of the present invention. The chart 400 includes the distribution 140 of threshold voltages of the array of memory cells as shown in Prior Art FIG. 1, for comparing the distribution of voltage thresholds after correction for over-erasure of the fast bits.

Curved line 410 is shown juxtaposed against the Gaussian distribution of threshold voltages 140 after an erase scheme. The Gaussian distribution of threshold voltages as shown in curved line 410 corrects for the over-erasure of fast bits. In one embodiment, the fast bits have been programmed to approximately 0 volts. In another embodiment, the fast bits have been programmed to above 0 volts.

Another advantage provided for in the method of repairing over-erasure of fast bits is the ability to compact the voltage threshold distribution of the memory array. Returning to FIG. 4, the voltage threshold distribution as shown in curve 410 is tighter than the ideal Gaussian distribution, as shown in curve 140, of threshold voltages. The distribution of threshold voltage as shown in dotted curve 410 is more compact around the center of the curve (line 420) than the distribution in curve 140. This can eliminate the use of soft-program approaches used for traditional compacting programming. A tighter distribution is beneficial in multi-level memory cells with various voltage levels defining various memory states. With tighter distribution of threshold voltages, the various voltage levels are more defined and separated from each other, and more voltage levels can be implemented.

Figure 5:
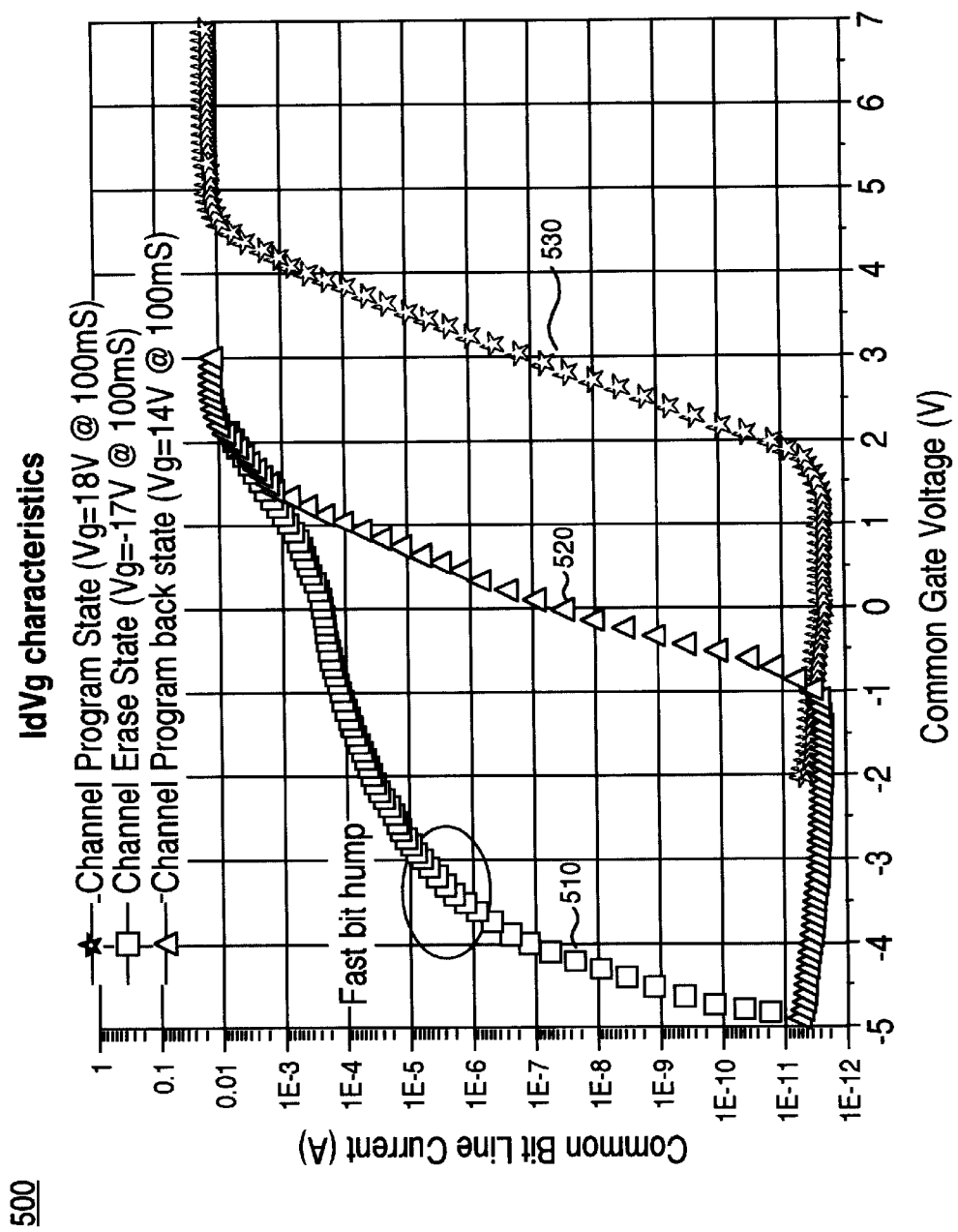
FIG. 5 is current versus voltage chart illustrating the conditions of a memory cell both before and after a program disturb operation for repairing over-erasure, in accordance with one embodiment of the present invention.

FIG. 5 is a diagram 500 plotting device data characteristics with the use of the channel self-limited program disturb for repairing over-erasure of fast bits. Diagram 500 exhibits the current ($I_{Drain}$) versus control gate voltage ($V_{Gate}$) of a typical flash memory cell. Curve 510 illustrates the fast bit hump typical of over-erasure of the memory cell. Curve 520 illustrates the desired $I_D$ VS. $V_G$ curve after correcting for over-erasure of the fast bits. Curve 530 illustrates the shifting of the $I_D$ VS. $V_G$ curve of the memory cell in a programmed state, where the corresponding threshold voltage is higher.

The preferred embodiment of the present invention, a method for performing a program disturb operation on an array of memory cells for repairing over-erasure of fast bits, is thus described. While the present invention has been described in particular embodiments, it should be appreciated that the present invention should not be construed as limited by such embodiments, but rather construed according to the below claims.

What is claimed is:

1. In a non-volatile memory comprising at least one array of memory cells arranged in a plurality of rows and a plurality of columns, a plurality of word lines coupled to said plurality of rows, a plurality of bit lines coupled to said plurality of columns, each of the memory cells comprising a source, a control gate coupled to a word line, and a drain coupled to a bit line, and capable of storing a respective bit, a method for correcting over-erasure of said array of memory cells comprising the step of:

performing an array wide program disturb operation on said array of memory cells for repairing over-erasure of fast bits.

2. The method of claim 1, wherein said fast bits have threshold voltages below 0 Volts.

3. The method of claim 1, wherein said performing an array wide program disturb operation comprises:

applying a substrate voltage to a substrate common to memory cells in said array of memory cells; and applying a gate voltage to said plurality of word lines of said array of memory cells, wherein a voltage differential between said control gate and said substrate in at least one of said array of memory cells is in the range of about 9 Volts to about 20 Volts.

4. The method of claim 3, wherein said voltage differential is about 14 Volts, and wherein said substrate voltage is approximately −7 Volts, and said gate voltage is approximately +7 Volts.

5. The method of claim 3, wherein said substrate voltage and said gate voltage is applied with a program pulse time from about 10 microseconds to 1 second.

6. The method of claim 1, wherein said array wide program disturb operation is for programming said fast bits back to a normal distribution of voltage thresholds for said array of memory cells.

7. The method of claim 6, wherein said fast bits are programmed to approximately 0 Volts.

8. The method of claim 1, wherein said program disturb operation is for compacting a voltage threshold distribution that is tighter than a Gaussian distribution of voltage thresholds of said array of memory cells.

9. In a non-volatile memory cell comprising a source, a control gate, and a drain, and capable of storing a bit, a method for correcting over-erasure of said non-volatile memory cell comprising the step of:

applying a substrate voltage to a substrate of said memory cell; and applying a gate voltage to said control gate that is more positive than said substrate voltage.

10. The method of claim 9, where in a volt age differential between said control gate and said substrate is in the range of about +0 Volts to about +15 Volts.

11. The method of claim 10, wherein said voltage differential is about 14 Volts, and wherein said substrate voltage is approximately −7 Volts, and said gate voltage is approximately +7 Volts.

12. The method of claim 9, wherein said substrate voltage and said gate voltage is applied with a program pulse of approximately 10 microseconds to 1 second.

13. The method of claim 9, wherein said memory cell is a NOR flash memory cell.

14. The method of claim 9, further comprising before said applying a substrate voltage:

performing a fast erase operation on said memory cell.

15. The method of claim 9, further comprising:

floating said drain; and floating said source.

16. The method of claim 9, wherein said memory cell is a memory cell within a non-volatile memory comprising at least one array of memory cells arranged in a plurality of rows and a plurality of columns, a plurality of word lines coupled to said plurality of rows, a plurality of bit lines coupled to said plurality of columns, each of the memory cells comprising a source, a control gate coupled to a word line, and a drain coupled to a bit line, and capable of storing a respective bit.

17. In a non-volatile memory comprising at least one array of memory cells arranged in a plurality of rows and a plurality of columns, a plurality of word lines coupled to said plurality of rows, a plurality of bit lines coupled to said plurality of columns, each of the memory cells comprising a source, a control gate coupled to a word line, and a drain coupled to a bit line, and capable of storing a respective bit, a method for correcting over-erasure of said array of memory cells comprising the step of:

performing a program disturb operation on a word line of said plurality of word lines for repairing over-erasure of fast bits.

18. The method as described in claim 17, further comprising:

performing said program disturb operation on said plurality of word lines for repairing over-erasure of fast bits.

19. The method as described in claim 17, further comprising:

applying a substrate voltage to a substrate common to memory cells in said word line; and applying a gate voltage to said word line, wherein a voltage differential between said control gate coupled to said word line and said substrate is in the range of about 9 Volts to about 20 Volts.

20. The method of claim 17, wherein said substrate voltage and said gate voltage is applied with a program pulse time from about 10 microseconds to 1 second.

* * * * *